United States Patent
Ellis-Monaghan et al.

(10) Patent No.: US 9,691,812 B2
(45) Date of Patent: Jun. 27, 2017

(54) PHOTODETECTOR AND METHODS OF MANUFACTURE

(71) Applicant: INTERNATIONAL BUSINESS MACHINES CORPORATION, Armonk, NY (US)

(72) Inventors: John J. Ellis-Monaghan, Grand Isle, VT (US); John C. S. Hall, New Hartford, CT (US); Marwan H. Khater, Astoria, NY (US); Edward W. Kiewra, South Burlington, VT (US); Steven M. Shank, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/699,015

(22) Filed: Apr. 29, 2015

(65) Prior Publication Data

US 2016/0322419 A1    Nov. 3, 2016

(51) Int. Cl.
    *H01L 31/062*     (2012.01)
    *H01L 31/113*     (2006.01)
    *H01L 27/146*     (2006.01)

(52) U.S. Cl.
    CPC .. *H01L 27/14687* (2013.01); *H01L 27/14643* (2013.01); *H01L 27/14685* (2013.01); *H01L 27/14692* (2013.01); *H01L 27/14694* (2013.01)

(58) Field of Classification Search
    CPC ......... H01L 27/14687; H01L 27/14643; H01L 27/14689; H01L 27/14685; H01L 27/14867

USPC .......................................................... 257/292
See application file for complete search history.

(56) References Cited

U.S. PATENT DOCUMENTS

| | | | |
|---|---|---|---|
| 5,228,948 A | 7/1993 | Deguchi | |
| 7,547,914 B2 | 6/2009 | Kermarec et al. | |
| 7,875,522 B2 | 1/2011 | Kapur et al. | |
| 8,299,485 B2 | 10/2012 | Celler | |
| 8,765,536 B2 | 7/2014 | Assefa et al. | |
| 2007/0262296 A1 | 11/2007 | Bauer | |
| 2014/0091374 A1* | 4/2014 | Assefa | H01L 27/1443 257/290 |
| 2014/0185981 A1 | 7/2014 | Assefa et al. | |

OTHER PUBLICATIONS

U.S. Appl. No. 14/068,461, filed Oct. 31, 2013, not yet published, specification and drawings, 38 pages.

* cited by examiner

*Primary Examiner* — David S Blum
(74) *Attorney, Agent, or Firm* — Michael LeStrange; Andrew M. Calderon; Roberts Mlotkowski Safran Cole & Calderon, P.C.

(57) ABSTRACT

Photodetector structures and methods of manufacture are provided. The method includes forming undercuts about detector material formed on a substrate. The method further includes encapsulating the detector to form airgaps from the undercuts. The method further includes annealing the detector material causing expansion of the detector material into the airgaps.

9 Claims, 7 Drawing Sheets

PHOTODETECTOR AND METHODS OF MANUFACTURE

FIELD OF THE INVENTION

The invention relates to semiconductor structures and, more particularly, to photodetector structures and methods of manufacture.

BACKGROUND

Photodectors are sensors which can detect light or other electromagnetic energy. There are many different types of photodectors such as active pixel sensors. Active-pixel sensors (APSs) are image sensors fabricated using CMOS processes, and are thus also known as CMOS image sensors. Active pixel sensors are commonly used in cell phone cameras, web cameras, and some digital single-lens reflex cameras (DSLRs).

The photodectors can be fabricated with Ge material using CMOS processes. For example, fabrication of crystalline Ge photodetectors is by liquid phase epitaxy of amorphous Ge material, which requires encapsulation with a multilayer dielectric stack to form a crucible in which the Ge is melted during rapid thermal anneal. However, amorphous Ge has high density (small volume), whereas crystalline Ge has lower density (larger volume), resulting in Ge volume expansion inside the encapsulation stack during the anneal process. This expansion leads to the formation of cracks/breaks of the encapsulation layers which, in turn, causes Ge removal during subsequent wet etch processing.

SUMMARY

In an aspect of the invention, a method comprises forming undercuts about detector material formed on a substrate. The method further comprises encapsulating the detector to form airgaps from the undercuts. The method further comprises annealing the detector material causing expansion of the detector material into the airgaps.

In an aspect of the invention, a method comprises: forming a first insulator material on a substrate; forming a detector material on the first insulator material; forming a second insulator material on the detector material; forming a masking material on the second insulator material; patterning of the first insulator material, the second insulator, the detector material and the masking material to define a detector with insulator tabs; removing the insulator tabs above and below the detector material to form undercuts; encapsulating the detector to form airgaps from the undercuts; and annealing the detector material causing expansion of the detector material into the airgaps.

In an aspect of the invention, a structure comprises an encapsulated expanded crystalline detector material formed under an encapsulating material and within airgaps formed above and below the detector material prior to expansion.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to photodetector structures and methods of manufacture. More specifically, the present invention is directed to an integrated Ge photodiode with Si CMOS and other photonics devices on silicon-on-insulator material (SOI). Advantageously, the processes of the present invention allow Ge expansion inside an encapsulation stack during the anneal process, while preventing or eliminating the formation of cracks/breaks of the encapsulation layers. Accordingly, by implementing the processes described herein, there is no Ge removal or loss during wet etching processes.

By way of illustrative example, in embodiments described herein, additional dielectric layer(s) can be deposited underneath and/or above amorphous Ge. The dielectric layer(s) are partially or fully removed after amorphous Ge patterning and before encapsulation stack deposition to allow voids/airgaps formation around the amorphous Ge material inside the encapsulation. These voids/airgaps allow Ge volume expansion during liquid phase epitaxy (annealing processes) without compromising the encapsulation stack.

In more specific embodiments, the encapsulated Ge region has a built in air/vacuum gap region which can be defined by recesses of a hardmask or oxide layer used to couple light from the waveguide into the Ge photodector. In embodiments, wet etch processes are used to recess the oxide. In embodiments, the oxide hard mask and oxide coupling layer can be patterned such that all of the oxide can be removed or some of the oxide can be removed. Moreover, annealing of amorphous Ge can be performed to convert to higher volume polycrystalline Ge or single crystalline Ge within the gap or void.

The photodetector of the present invention can be manufactured in a number of ways using a number of different tools. In general, though, the methodologies and tools are used to form structures with dimensions in the micrometer and nanometer scale. The methodologies, i.e., technologies, employed to manufacture the photodetector have been adopted from integrated circuit (IC) technology. For example, the structures of the present invention are built on wafers and are realized in films of material patterned by photolithographic processes on the top of a wafer. In particular, the fabrication of the photodetector uses three basic building blocks: (i) deposition of thin films of material on a substrate, (ii) applying a patterned mask on top of the films by photolithographic imaging, and (iii) etching the films selectively to the mask.

Figure 1:
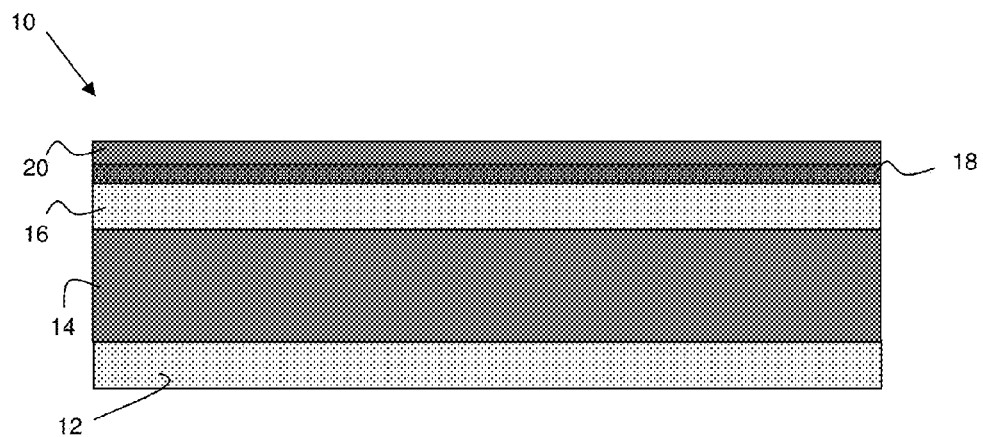
FIG. 1 shows fabrication processes and a respective structure in accordance with aspects of the invention.

FIG. 1 shows a structure and respective fabrication processes in accordance with aspects of the invention. The structure 10 includes an insulator layer 14 (e.g., oxide) formed on a substrate 12. A semiconductor layer 16 is formed on the insulator layer 14. In embodiments, the semiconductor layer 16 may be composed of any suitable material including, but not limited to, Si, SiGe, SiGeC, SiC, Ge alloys, GaAs, InAs, InP, and other III/V or II/VI compound semiconductors.

In an illustrative embodiment, the combination of the layers 12, 14, 16 can form a silicon-on-insulator (SOI) substrate. The SOI substrate can be formed in any conventional manner including, e.g., SiMOX or other known bonding or deposition methods. In embodiments, the insulator layer 14 can be about 1 to 3 microns in thickness and the semiconductor layer 16 can be about 500 Å to 3000 Å; although other dimensions are also contemplated by the present invention.

Still referring to FIG. 1, a nitride layer 18 is formed on the semiconductor layer 16. In embodiments, the nitride layer 18 can be deposited using known deposition methods such as, for example, plasma enhanced chemical vapor deposition (PECVD) or rapid thermal chemical vapor deposition (RTCVD) processes. The nitride layer 18 can be deposited to a thickness of about 200 Å to 1500 Å. An insulator layer 20, e.g., oxide, is deposited on the nitride layer 18. In embodiments, the insulator layer 20 can be deposited using a low temperature CVD process, to a thickness of about 200 Å to 1500 Å.

Figure 2:
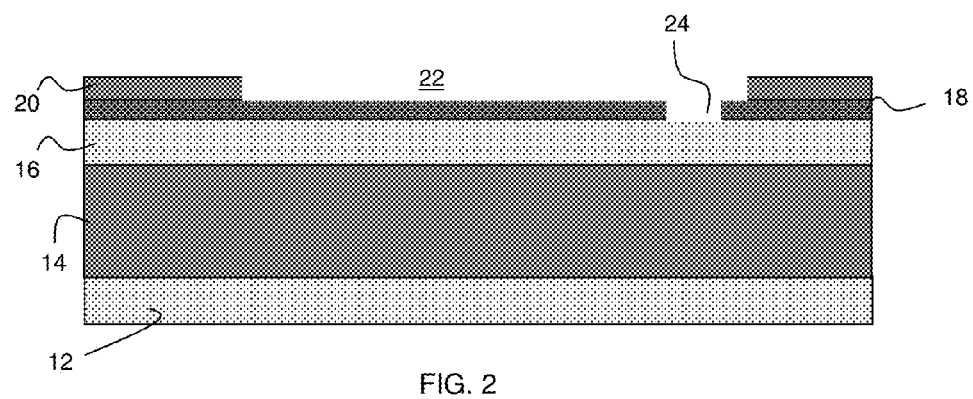
FIG. 2 shows fabrication processes to form an opening and window in different layers, and a respective structure in accordance with aspects of the invention.

In FIG. 2, an opening 22 is formed within the insulator layer 20 using conventional lithography and etching processes. For example, a resist can be formed on the insulator layer 20 which is then exposed to energy (light) to form a pattern. A reactive ion etching (RIE) is performed through the pattern to form the opening 22. The resist can then be stripped using conventional processes such as oxygen ashing or other stripants. A window or opening 24 is then formed in the nitride layer 18 to expose a portion of the underlying semiconductor layer 16. In embodiments, the opening 24 is smaller than the opening 22, and will act as a seed or crystallization window used to grow Ge in subsequent fabrication processes. The opening 24 can be formed by conventional lithography and etching processes, as already described herein.

Figure 3:
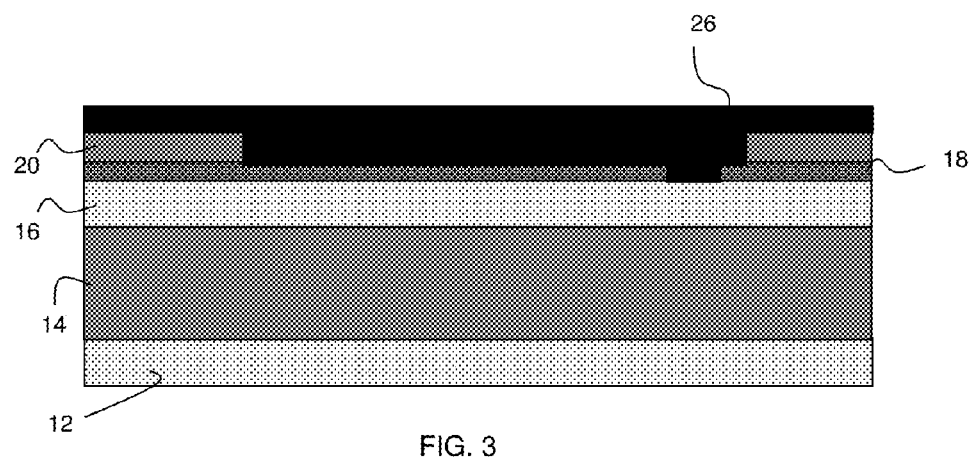
FIG. 3 shows fabrication processes to form a detector material layer and a respective structure in accordance with aspects of the invention.

In FIG. 3, a Ge layer 26 is formed on the structure, and more specifically within the opening 24 and on the remaining exposed layers 18, 20. In embodiments, the Ge layer 26 is amorphous or polycrystalline Ge, deposited using a PECVD process. As should be understood by those of skill in the art, the exposed portion of the underlying semiconductor layer 16 (through opening 24) will act as a seed layer during anneal processes subsequent to this deposition process. In embodiments, the Ge layer 26 can be deposited to a thickness of about 1000 Å to 3000 Å.

Figure 4:
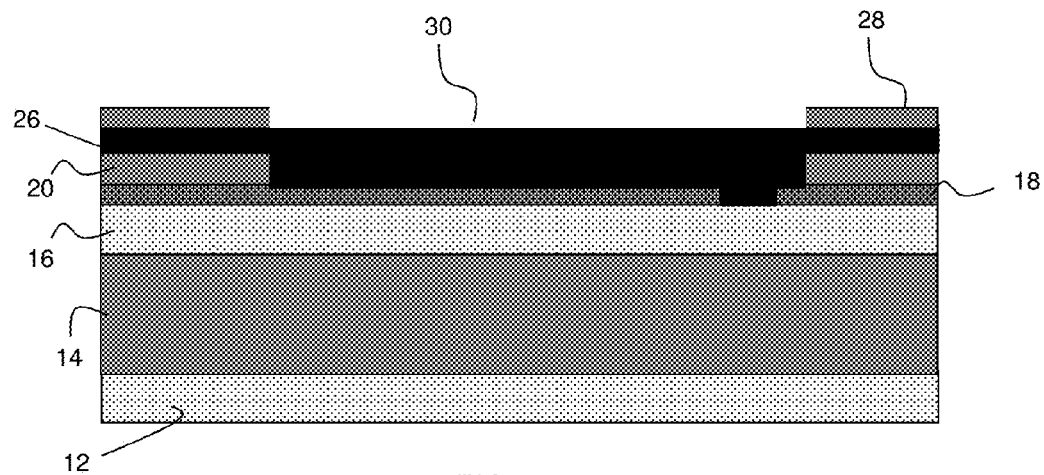
FIG. 4 shows fabrication processes to form an insulator layer amongst other features and a respective structure in accordance with aspects of the invention.

As shown in FIG. 4, an insulator layer 28 is deposited on the Ge layer 26. In embodiments, the insulator layer 28 can be an oxide layer deposited using a low temperature CVD process. The insulator layer 28 can be deposited to a thickness of about 200 Å to 1500 Å. An opening 30 is formed within the insulator layer 28 using conventional lithography and etching processes as described herein. The opening 30 will expose a surface of the underlying Ge layer 26.

Figure 5:
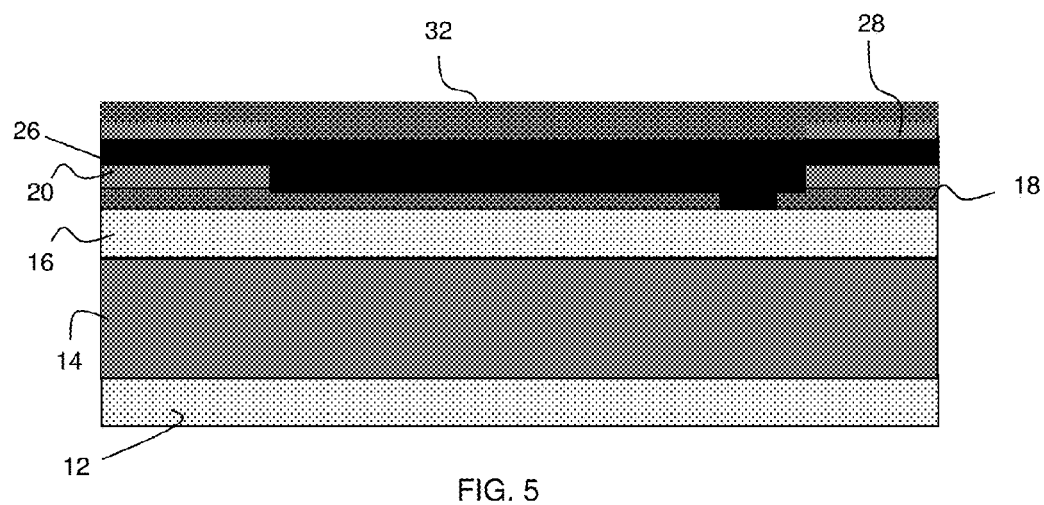
FIG. 5 shows fabrication processes to form a hardmask over an insulator layer amongst other features, and a respective structure in accordance with aspects of the invention.

In FIG. 5, a hardmask 32, e.g., nitride layer, is formed over the insulator layer 28 and within the opening 30. The nitride layer 32 can be deposited using conventional deposition processes as described herein.

Figure 6:
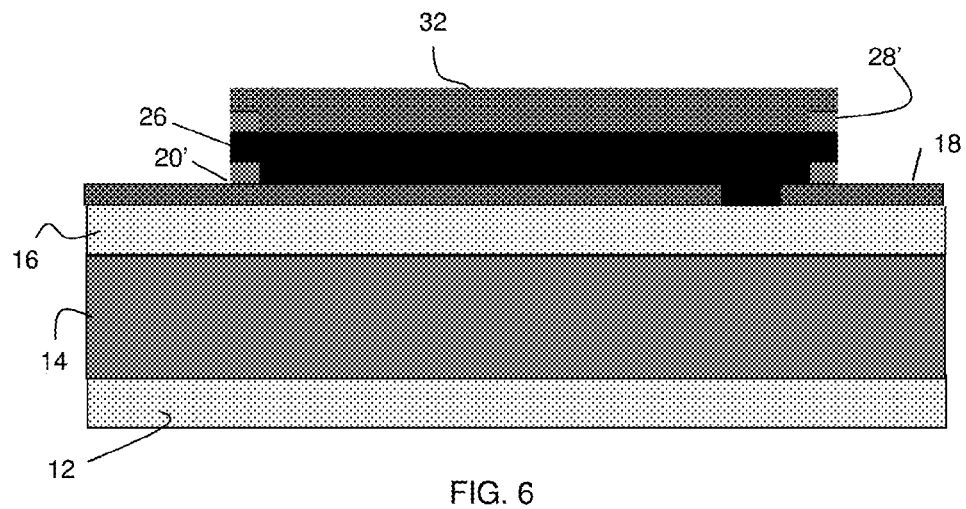
FIG. 6 shows fabrication processes to define a photodetector and a respective structure in accordance with aspects of the invention.

In FIG. 6, the layers 20, 26, 28 and 32 are patterned using conventional lithography and etching processes. In embodiments, the patterning process results in insulator tabs 20' and 28', above and below portions of the Ge layer 26. The patterning process will thus define a Germanium photodetector.

Figure 7:
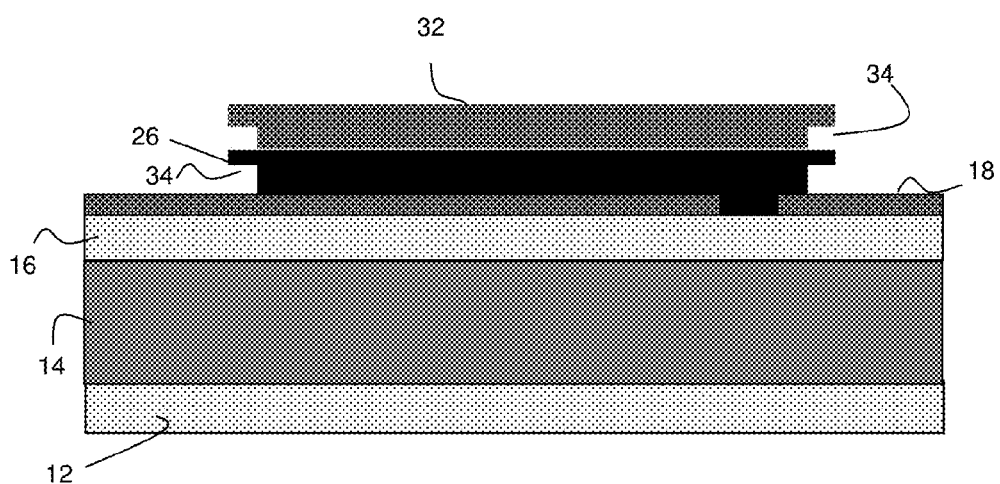
FIG. 7 shows fabrication processes to define undercuts above and below the photodetector, and a respective structure in accordance with aspects of the invention.

As shown in FIG. 7, the insulator tabs are removed to form undercuts or recesses 34 about portions of the Ge layer 26. In more specific embodiments, the undercuts or recesses 34 are formed above and below portions of the Ge layer 26. In embodiments, the undercuts or recesses 34 can be formed by an etching process selective to the insulator material, e.g., oxide. For example, the etching process can comprise an HF based wet etch to remove the insulator material and form the undercuts or recesses 34. The undercuts or recesses 34 can be about 100 Å to 500 Å, or other dimensions which provide adequate space for expansion of the Ge material during subsequent annealing processes (without causing any cracks in the encapsulation).

Figure 8:
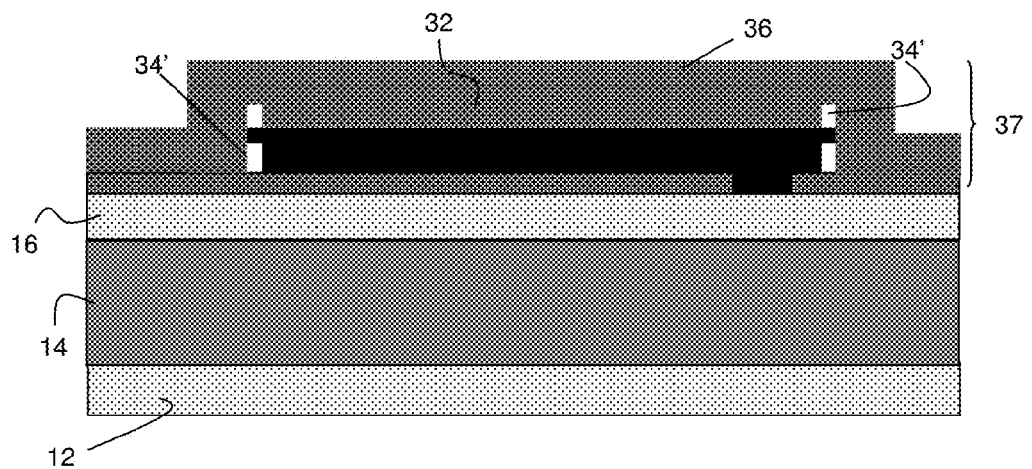
FIG. 8 shows fabrication processes to form an encapsulating structure and a respective structure in accordance with aspects of the invention.

In FIG. 8, an encapsulating (e.g., masking) material 36 is shown to be formed over the structure, e.g., layers 32 and 18, forming voids or airgaps 34'. In more specific embodiments, the voids or airgaps 34' are formed above and below portions of the Ge layer 26. The encapsulating material 36 can be a nitride material, for example. In embodiments, the encapsulating material 36 can be formed by deposition of nonconformal dielectric material (e.g., PECVD nitride or oxide). This deposition process will form voids or gaps 34' inside the Germanium encapsulation, which will allow Ge volume expansion during crystallization and hence eliminate cracking of the encapsulation stack 37. In embodiments, the masking material will fully encapsulate the detector material, e.g., Ge material.

Figure 9:
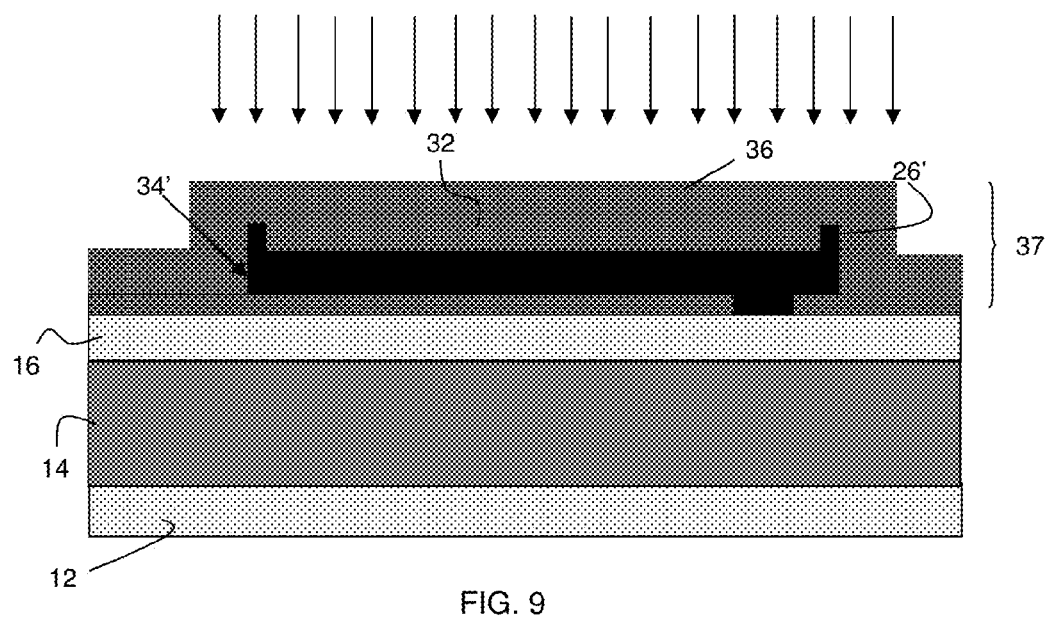
FIG. 9 shows fabrication processes to form an encapsulating photodetector structure and a respective structure in accordance with aspects of the invention.
Figure 10:
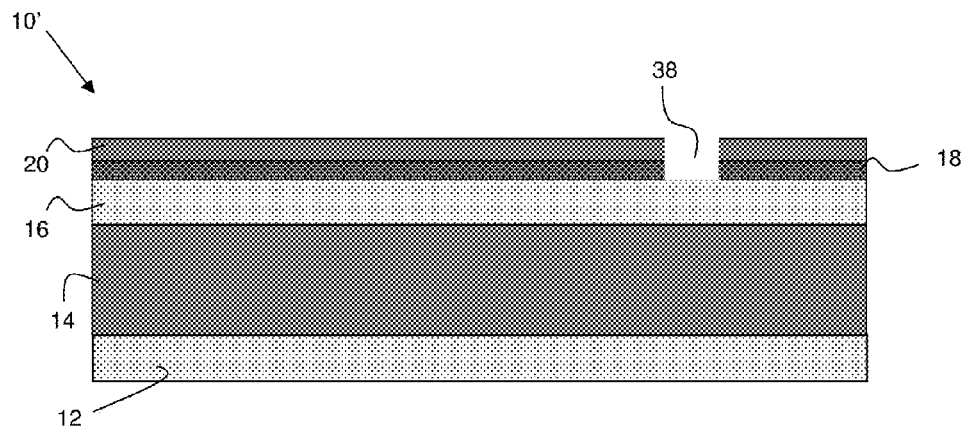
FIGS. 10-14 show fabrication processes and respective structures in accordance with additional aspects of the invention.

As shown in FIG. 9, the encapsulation stack 37 undergoes a rapid thermal anneal process to form crystalline Ge material 26'. In embodiments, the rapid thermal anneal process will crystallize the Ge material, which results in an expansion into the voids or airgaps 34'. Advantageously, the Ge material can expand into the voids or airgaps 34', thus preventing crack formation in the encapsulation stack 37 or materials formed therein.

FIGS. 10-14 show an alternative structure and respective fabrication processes in accordance with aspects of the invention. Similar to the structure of FIG. 1, the structure 10' shown in FIG. 10 includes an insulator layer 14 (e.g., oxide) formed on a substrate 12. A semiconductor layer 16 is formed on the insulator layer 14. In embodiments, the semiconductor layer 16 may be composed of any suitable material including, but not limited to, Si, SiGe, SiGeC, SiC, Ge alloys, GaAs, InAs, InP, and other III/V or II/VI compound semiconductors. In embodiments, the combination of the layers 12, 14, 16 can form a silicon-on-insulator (SOI) substrate.

A nitride layer 18 is formed on the semiconductor layer 16. In embodiments, the nitride layer 18 can be deposited using known deposition methods such as, for example, PECVD or RTCVD processes. The nitride layer 18 can be deposited to a thickness of about 200 Å to 1500 Å. An insulator layer 20, e.g., oxide, is deposited on the nitride layer 18. In embodiments, the insulator layer 20 can be deposited using a low temperature CVD process, to a thickness of about 200 Å to 1500 Å. An opening 38 is formed within the insulator layer 20 and nitride layer 18 to expose a portion of the semiconductor layer 16. The opening 38 can be formed by conventional lithography and etching processes, as already described herein, and will act as a seed or crystallization window used to grow Ge in subsequent fabrication processes.

Figure 11:
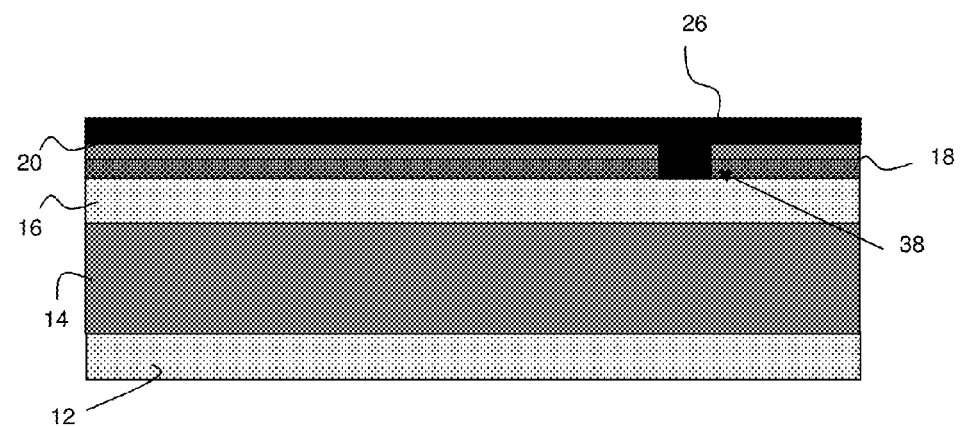

In FIG. 11, a Ge layer 26 is formed on the structure, and more specifically within the opening 38 and on the remaining exposed layer 20. In embodiments, the Ge layer 26 is amorphous or polycrystalline Ge, deposited using a PECVD process. As should be understood by those of skill in the art, the exposed portion of the underlying semiconductor layer 16 (through opening 38) will act as a seed layer during anneal processes subsequent to this deposition process. In embodiments, the Ge layer 26 can be deposited to a thickness of about 1000 Å to 3000 Å.

Figure 12:
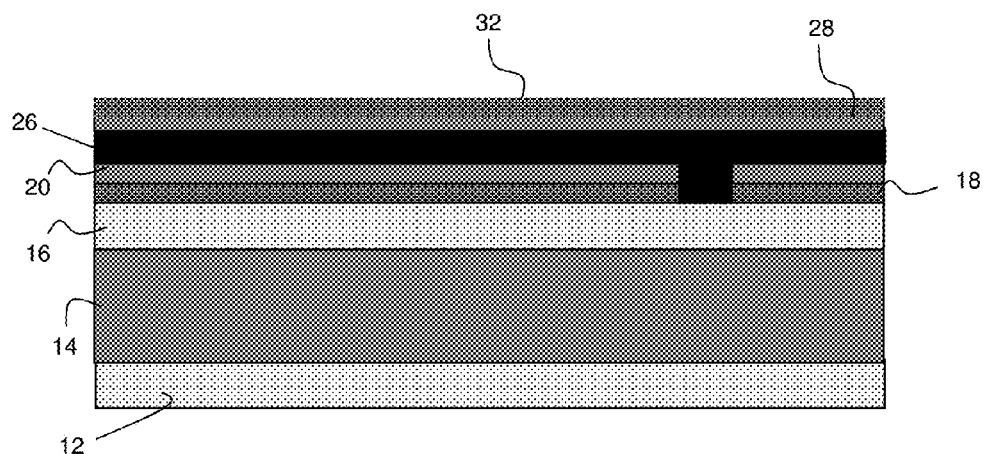

As shown in FIG. 12, an insulator layer 28 is deposited on the Ge layer 26. In embodiments, the insulator layer 28 can be an oxide layer deposited using a low temperature CVD process. The insulator layer 28 can be deposited to a thickness of about 200 Å to 1500 Å. A hardmask 32, e.g., nitride layer, is formed over the insulator layer 28. The nitride layer 32 can be deposited using conventional deposition processes as described herein.

Figure 13:
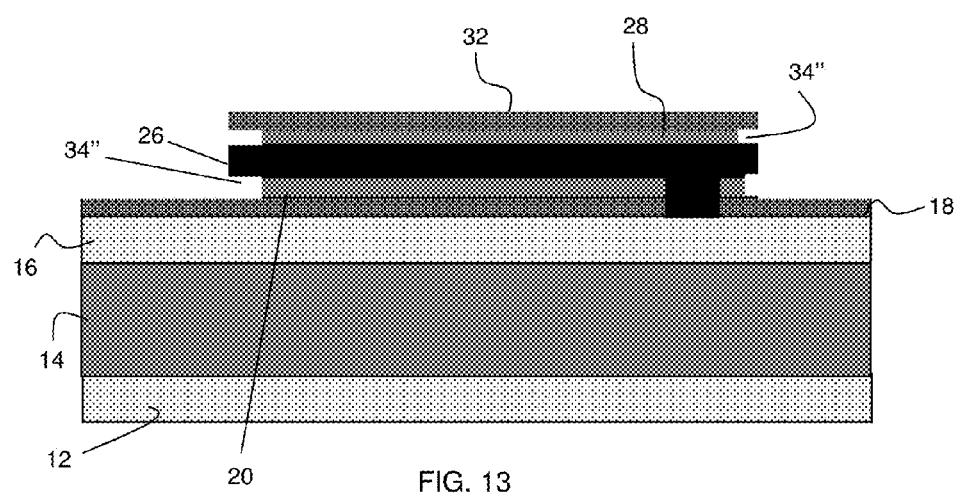

In FIG. 13, the layers 20, 26, 28 and 32 are patterned using conventional lithography and etching processes. The patterning process will thus define a Germanium photodetector. Thereafter, any remaining insulator material about the Ge layer 26, e.g., insulator tabs, resulting from the patterning process are removed thereby forming undercuts or recesses 34". In more specific embodiments, the undercuts or recesses 34" are formed above and below portions of the Ge layer 26.

In embodiments, the undercuts or recesses 34" can be formed by an etching process selective to the insulator material, e.g., oxide, as already described herein. The undercuts or recesses 34" can be about 100 Å to 500 Å, or other dimensions which provide adequate space for expansion of the Ge material during subsequent annealing processes (without causing any cracks in the encapsulation).

Figure 14:
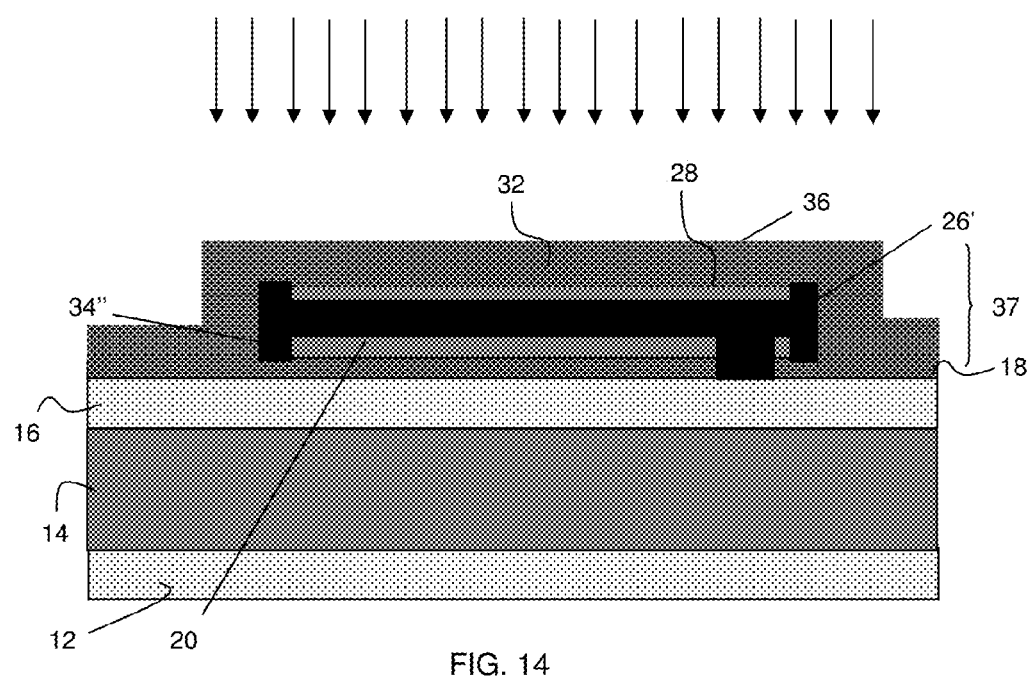

In FIG. 14, an encapsulating (e.g., masking) material 36 is shown to be formed over the structure, forming voids or airgaps 34'''. The encapsulating material 36 can be a nitride material, for example. In embodiments, the encapsulating material 36 can be formed by deposition of non-conformal dielectric material (e.g., PECVD nitride or oxide) to form voids or airgaps 34''' inside the encapsulation stack 37 to allow Ge volume expansion during crystallization and hence eliminate cracking of the encapsulation stack 37. In embodiments, masking material will fully encapsulate the detector material, e.g., Ge material.

As further shown in FIG. 14, the encapsulation stack 37 undergoes a rapid thermal anneal process to form crystalline Ge material 26'. In embodiments, the rapid thermal anneal process will crystallize the Ge material, which results in an expansion into the voids or airgaps gaps 34'''. Advantageously, the Ge material can expand into the voids or gaps 34''', preventing crack formation in the encapsulation stack 37 or materials formed therein.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure, comprising:
   an encapsulated expanded crystalline detector material formed over a first layer of insulating material;
   a second layer of insulating material formed on an upper surface of the expanded crystalline detector material and aligned with edges of the encapsulated expanded crystalline detector; and
   an encapsulated material formed on a surface of the second layer of insulating material and in contact with the edges of the encapsulated expanded crystalline detector, wherein
   the second layer of insulating material has an undercut portion,
   the encapsulated expanded crystalline detector material is located within the undercut portion of the second layer of insulating material, and
   the first layer of insulating material, the second layer of insulating material and the encapsulated material encapsulates the encapsulated expanded crystalline detector.

2. The structure of claim 1, wherein the first layer of insulating material, the second layer of insulating material and the encapsulating material is nitride material.

3. The structure of claim 1, wherein the encapsulated expanded crystalline detector material is Ge material.

4. The structure of claim 1, wherein the encapsulated expanded crystalline detector material includes tabs which extend into the undercut.

5. The structure of claim 1, wherein the encapsulated expanded crystalline detector material is Ge material which contacts an underlying semiconductor material through an opening in an insulator layer.

6. The structure of claim 5, wherein the Ge material contacts the underlying semiconductor material through the opening in the insulator layer and the first layer of insulating material is composed of a nitride layer between the underlying semiconductor material and the insulator layer.

7. The structure of claim 5, wherein the Ge material is polycrystalline Ge.

8. The structure of claim 5, wherein the Ge material is deposited to a thickness of about 1000 Å to 3000 Å.

9. The structure of claim 1, wherein the encapsulated expanded crystalline detector material is composed of Ge material which is formed over an insulator layer and nitride layer, and within a single opening in the insulator layer and nitride layer to expose underlying semiconductor layer.

* * * * *